(12) United States Patent
Kang et al.

(10) Patent No.: US 8,766,651 B2
(45) Date of Patent: Jul. 1, 2014

(54) CAPACITIVE FINGERPRINT SENSOR

(75) Inventors: Moon Hyo Kang, Seoul (KR); Ji Ho Hur, Yongin-si (KR)

(73) Assignee: Silicon Display Technology (KR)

( * ) Notice: Subject to any disclaimer, the term of this patent is extended or adjusted under 35 U.S.C. 154(b) by 53 days.

(21) Appl. No.: 13/556,551

(22) Filed: Jul. 24, 2012

(65) Prior Publication Data

US 2013/0314148 A1 Nov. 28, 2013

Related U.S. Application Data

(63) Continuation of application No. PCT/KR2012/004031, filed on May 22, 2012.

(51) Int. Cl.
*G01R 27/26* (2006.01)
(52) U.S. Cl.
USPC .............. 324/662; 324/663; 324/762.02
(58) Field of Classification Search
USPC ............... 324/658, 662, 663, 671, 686, 687, 324/762.02
See application file for complete search history.

(56) References Cited

U.S. PATENT DOCUMENTS

| | | | |
|---|---|---|---|
| 6,657,269 B2 | 12/2003 | Migliorato et al. | |
| 2005/0088185 A1* | 4/2005 | Sano et al. | 324/661 |
| 2007/0024546 A1* | 2/2007 | Jang et al. | 345/78 |

FOREIGN PATENT DOCUMENTS

| | | |
|---|---|---|
| EP | 0980563 B1 | 5/2003 |
| JP | 2001311752 A | 11/2001 |
| JP | 2002287887 A | 10/2002 |
| JP | 2003004697 A | 1/2003 |
| JP | 2004093266 A | 3/2004 |
| JP | 2006220492 A | 8/2006 |
| KR | 1020010012248 A | 2/2001 |

OTHER PUBLICATIONS

International Search Report; PCT/KR2012/004031; Feb. 7, 2013.

* cited by examiner

*Primary Examiner* — Vincent Q Nguyen
(74) *Attorney, Agent, or Firm* — Stevens & Showalter, LLP

(57) ABSTRACT

The capacitive fingerprint sensor according to the exemplary embodiments of the present invention includes: a fingerprint sensing electrode Cfp for sensing a human fingerprint; a first transistor T1 in which the amount of currents flowing therethrough changes depending on an output voltage of the fingerprint sensing electrode Cfp; a second transistor T2 in which the amount of currents flowing therethrough changes due to a difference between the currents flowing through the first transistor T1; and a third transistor T3 which resets a gate electrode of the first transistor T1 and provides capacitive coupling with the gate electrode of the first transistor T1 via a pulse signal.

17 Claims, 15 Drawing Sheets

PRIOR ART

PRIOR ART

PRIOR ART (a) $\Delta V_{pulse}$ (b) Gate Voltage Of T1

(b1) Pixel Touched With Valley  (b2) Pixel Touched With Ridge  (b3) Pixel Touched With Ridge (c) Gate Voltage Of T2

Pixel Touched With Valley

Pixel Touched With Ridge

CAPACITIVE FINGERPRINT SENSOR

CROSS REFERENCE TO RELATED APPLICATIONS

This application is a Continuation of PCT International Application No. PCT/KR2012/004031 filed on May 22, 2012. The entire contents of all of the above application are hereby incorporated by reference into the present application.

BACKGROUND OF THE INVENTION

1. Field of the Invention

The present invention relates to a capacitive fingerprint sensor, more specifically, a capacitive fingerprint sensor which is able to enhance sensing sensitivity and is resistant to ESD damage or a physical impact.

2. Description of the Related Arts

FIG. 1 through FIG. 4 are equivalent circuit views illustrating a capacitive type fingerprint sensor using a thin film transistor according to some exemplary embodiments of a conventional art.

As illustrated in FIG. 1, the conventional capacitive type fingerprint sensor using the thin film transistor uses an active pixel structure to thereby include a source follower such as a T2 within a pixel, and thus is a sensor which can be driven without a preamplifier by recognizing the change of a capacitance based on fingerprints as the change of a voltage in an ADC (Analog-to-Digital Converter) through a data read-out line. A reset is performed using a VDD voltage within the pixel.

The conventional capacitive fingerprint sensor uses a way in which different voltages from each other are applied to a gate of the T2 one time during one frame depending on a fingerprint by using a scan signal or applying a pulse voltage Vpulse which provides separate capacitive coupling so that different currents from each other can flow through the T2. At this time, when a capacitance by the fingerprint is Cfp and the amplitude of a scan signal is $\Delta V_{pulse}$, the voltage applied to the gate may be expressed as following mathematical formula 1.

$$\Delta V_{g\_T2} = \frac{C_S + C_{para\_T1}}{C_S + C_{para\_T1} + C_{para\_T2} + C_{fp}} \times \Delta V_{pulse} \quad \text{\{Mathematical Formula 1\}}$$

$\Delta V_{g\text{-}T2}$ is the voltage applied to the gate of the T2, and the value thereof is changed depending on the capacitance Cfp generated by the fingerprint.

However, in the conventional capacitive fingerprint sensor, when the fingerprint capacitance Cfp is small, namely, a difference between the capacitances based on ridges of the fingerprint is small, $\Delta V_{g\text{-}T2}$ (a difference between the voltages applied to the gate of the T2) becomes smaller, thereby reducing fingerprint sensing sensitivity.

The sensing sensitivity is expressed as a dynamic range, $$\left(=20 \times \log \frac{Isignal}{Idark}\right),$$

and the conventional capacitive fingerprint sensor has a limit to increase a difference between the $I_{signal}$ and the $I_{dark}$, thereby generating a limit to enhance the sensing sensitivity.

Thus, in the way of the conventional capacitive fingerprint sensor which senses the fingerprint formed by using the fingers and a protective film of an upper part of the sensor as a dielectric, since the protective film of the upper part of the sensor may not be formed to be thick, the conventional capacitive fingerprint sensor is certainly weak to ESD damage or physical damage.

SUMMARY OF THE INVENTION

As aspect of the present invention to solve the aforesaid problems provides a fingerprint sensor which is able to enhance sensing sensitivity by primarily sensing and amplifying a difference between capacitances and secondarily amplifying an amplified signal within a pixel again.

Another aspect of the present invention provides a fingerprint sensor having a property which is resistant to ESD damage or a physical impact by forming a protective film of an upper part of a sensor to be large in thickness.

Still another aspect of the present invention provides a capacitive fingerprint sensor which is able to enhance sensing sensitivity by primarily sensing and amplifying a difference between capacitances and secondarily amplifying an amplified signal within a pixel again, and which is resistant to ESD damage or a physical impact by forming a protective film of an upper part of a sensor to be large in thickness depending on the enhancement of the sensing sensitivity.

The problems to be solved by the present invention are not limited to the above-mentioned matters, and other problems to be solved, which are not mentioned, can be clearly understood by those having ordinary skill in the art based on the following description.

According to an aspect of the present invention, there is provided a capacitive fingerprint sensor including: a fingerprint sensing electrode Cfp for sensing a human fingerprint; a first transistor T1 in which the amount of currents flowing therethrough changes depending on an output voltage of the fingerprint sensing electrode; a second transistor T2 in which the amount of currents flowing therethrough changes due to a difference between the currents flowing through the first transistor T1; and a third transistor T3 which resets a gate electrode of the first transistor T1 and provides capacitive coupling with the gate electrode of the first transistor T1 via a pulse signal.

Here, the capacitive fingerprint sensor may further include a pixel capacitance Cs connected between a drain electrode of the first transistor T1 and a power supply voltage VDD.

Furthermore, the capacitive fingerprint sensor may further include a fourth transistor T4 which is connected between the drain electrode of the first transistor T1 and the power supply voltage VDD, and is switched by a scan signal Scan n+1, or a scan signal Scan n−1 to thereby reset the second transistor T2 with the power supply voltage. At this time, the fourth transistor T4 may be formed of a PMOS or an NMOS.

The third transistor T3 may be configured in a diode shape. In particular, it may be configured such that when the first transistor T1 is the PMOS, the drain and gate electrodes is commonly connected to a gate of the first transistor T1, and when the first transistor T1 is the NMOS, the pulse signal is commonly input through the gate electrode and a source electrode.

Furthermore, the third transistor T3 may be formed of the PMOS which switches the pulse signal to the gate of the first transistor T1 using a reset signal.

The first through third transistors T1, T2 and T3 may be all formed of the PMOS or the first transistor T1 may be formed of the NMOS and the second and third transistors T2 and T3 may be formed of the PMOS, respectively. The second transistor T2 may be connected between the power supply voltage and a driving circuit unit 1.

The pulse signal may be formed as a clock signal in which a high voltage and a low voltage are repeated, and may be characterized in that the clock signal is continuously applied during one frame or is changed from a high voltage to a low voltage or from a low voltage to a high voltage one time during the period when an $N^{th}$ scan signal is selected.

At this time, when the pulse signal is the high voltage, the first transistor T1 is reset, and when the pulse signal is the low voltage, a change level of the gate voltage of the first transistor T1 is changed by capacitive coupling depending on the division of ridges and valleys of the fingerprint.

The fingerprint sensing electrode Cfp may be formed of a fingerprint capacitive (Cfp) electrode 2 and a protective film 3, and may sense a difference between the fingerprint capacitive (Cfp) electrode 2 and a formed capacitance depending on a difference in heights between the ridges and valleys of the fingerprint sensed in the protective film 3.

The capacitive fingerprint sensor may control a voltage level of the pulse signal to thereby control a voltage level of the gate of the first transistor T1, and as a result of this, the amount of the currents flowing through the second transistor T2 may be controlled.

Furthermore, the capacitive fingerprint sensor may further include a fifth transistor T5 which switches the currents flowing through the second transistor T2 so as to flow into the driving circuit unit 1 by a scan signal Scan n. At this time, the fifth transistor T5 may be formed of the PMOS.

Moreover, the capacitive fingerprint sensor according to an exemplary embodiment of the present invention may further include a sixth transistor T6 which is connected between the gate electrode of the second transistor T2 and the power supply voltage, and is switched by the scan signal Scan n+1 or the scan signal Scan n−1 to thereby reset a gate voltage of the second transistor T2.

Unlike the aforesaid structure, the capacitive fingerprint sensor may further include another sixth transistor T6 which is connected between the drain electrode and the gate electrode of the second transistor T2, and is switched by the scan signal Scan n+1 to thereby reset the gate voltage of the second transistor T2 while at the same time compensating a difference between threshold voltages. At this time, the sixth transistor T6 may be formed of the PMOS.

The transistors which are applied to the aforesaid configurations according to the exemplary embodiments of the present invention may be formed of the PMOS or the NMOS.

In accordance with some exemplary embodiments of the present invention, through multiple amplification for a difference between the fingerprint capacitances within the pixel, the amount of currents can be sufficiently generated, thereby being capable of enhancing the sensing sensitivity of a fingerprint sensor.

Furthermore, even in the case that a protective film of an upper part of the fingerprint sensor is produced to be thick, the sensing sensitivity can be improved, and thus the fingerprint sensor is advantageous that it is resistant to ESD damage or physical damage.

The effects of the present invention should not be limited to the matters as mentioned above. Other effects which are not mentioned can be clearly understood by those having ordinary skill in the art based on the following description.

BRIEF DESCRIPTION OF THE DRAWINGS

The above and other aspects, features and advantages of certain exemplary embodiments of the present invention will be more apparent from the following description taken in conjunction with the accompanying drawings, in which.

DETAILED DESCRIPTION OF THE INVENTION

Figure 1:
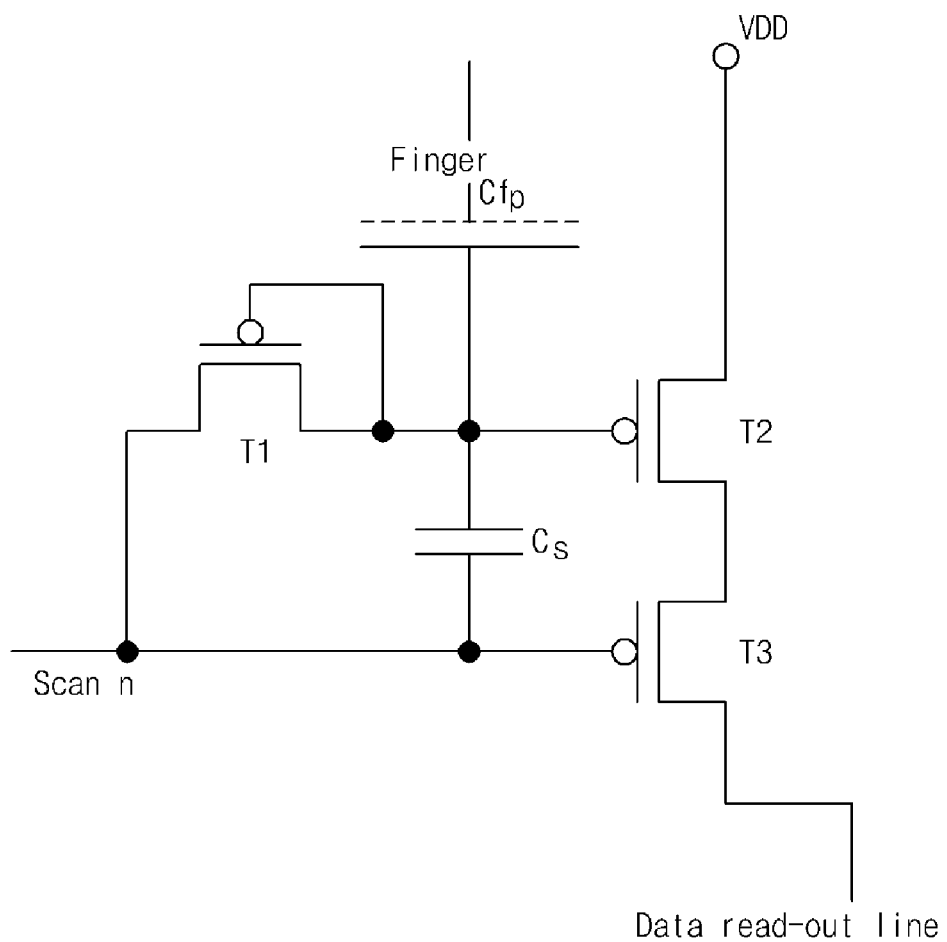
FIG. 1 through FIG. 4 are equivalent circuit views illustrating a capacitive fingerprint sensor using a thin film transistor according to some exemplary embodiments of a conventional art.
Figure 2:
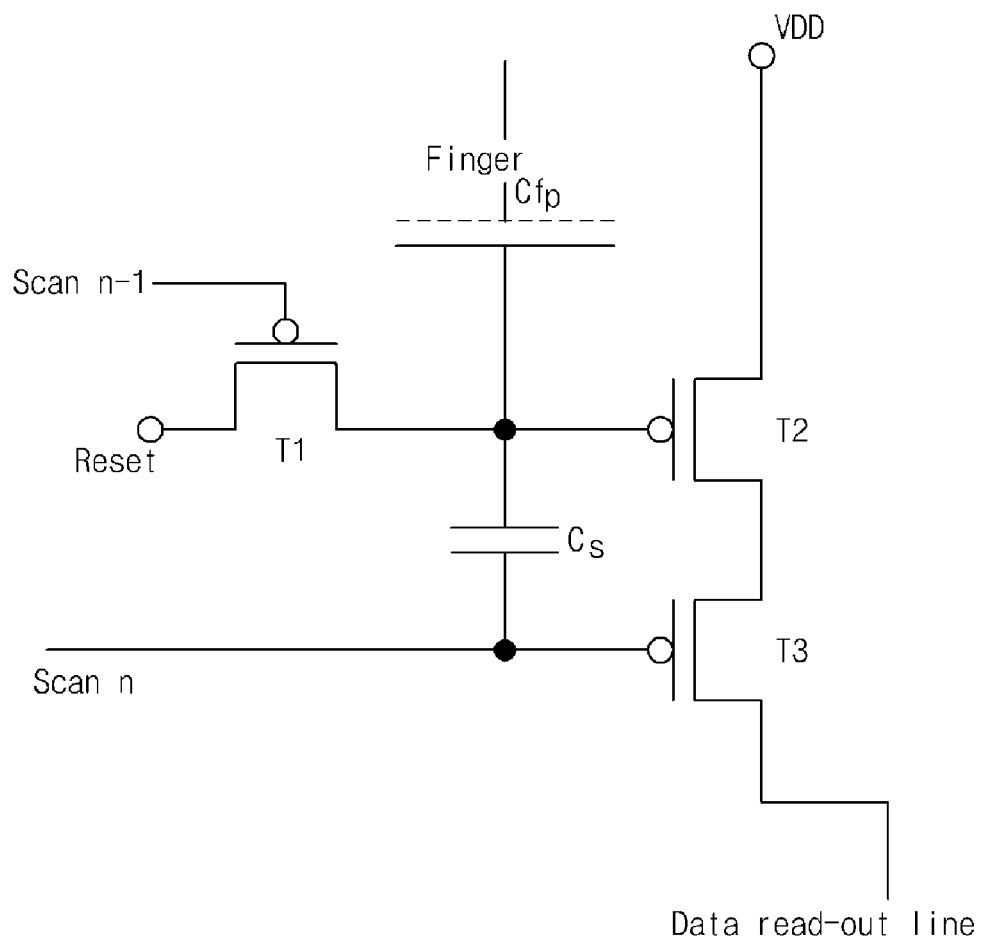
Figure 3:
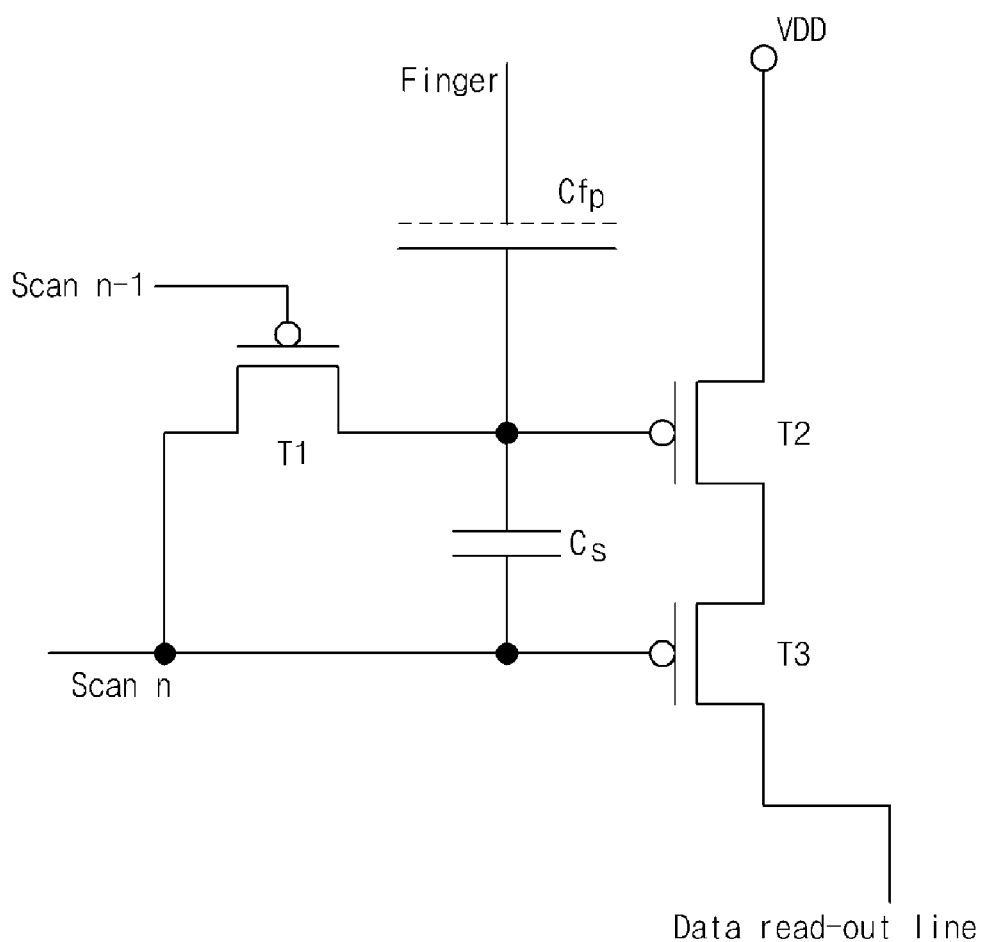
Figure 4:
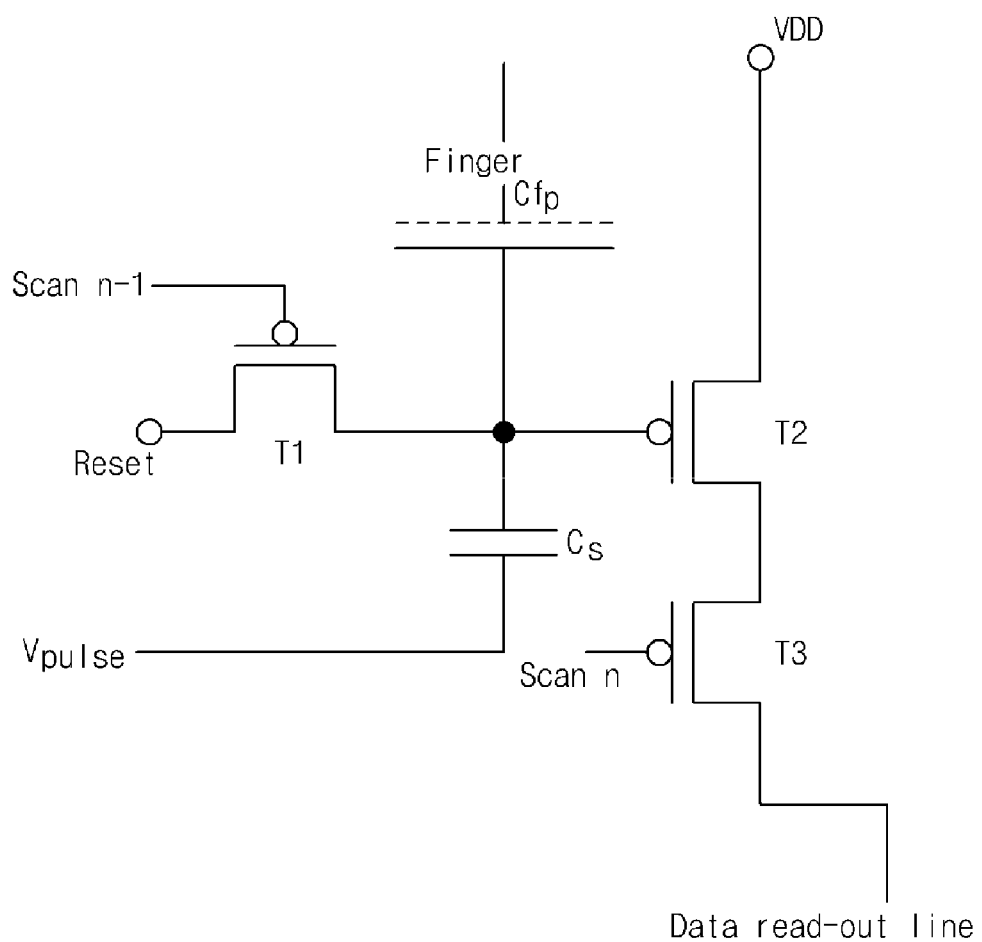

Exemplary embodiments according to the present invention will now be described more fully hereinafter with reference to the accompanying drawings so that those having ordinary skill in the art can easily embody. This invention may, however, be embodied in different forms and should not be construed as limited to the exemplary embodiments set forth herein. To clearly explain the present invention, in the drawings, the parts which have no relation with the explanation are omitted. Like numbers refer to like elements throughout the specification.

Hereinafter, the detailed technical contents to be carried out by the present invention will be described in detail with reference to the accompanying drawings.

A capacitive fingerprint sensor according to exemplary embodiments of the present invention is characterized in that due to a difference between gate voltages of a first transistor T1 caused by a difference between fingerprint capacitances, the amount of currents flowing through the first transistor T1 changes, and a difference between the gate voltages of a second transistor T2 is generated depending on the amount of the currents, and as a result of this, the amount of currents flowing through the second transistor T2 changes, thereby sensing the amount of the currents at a driving circuit unit.

At this time, a process in which the difference between the gate voltages of the first transistor is converted into the difference between the currents is called a primary conversion and amplification. Furthermore, a process in which the difference between the gate voltages of the second transistor is converted into the difference between the currents is called a secondary conversion and amplification. That is, the gist of the technology is that since the multiple amplification processes can be performed within a pixel, even in a case that the difference between the fingerprint capacitances is small, sensing can be performed by sufficient currents.

1. First Exemplary Embodiment of Capacitive Fingerprint Sensor

Figure 5:
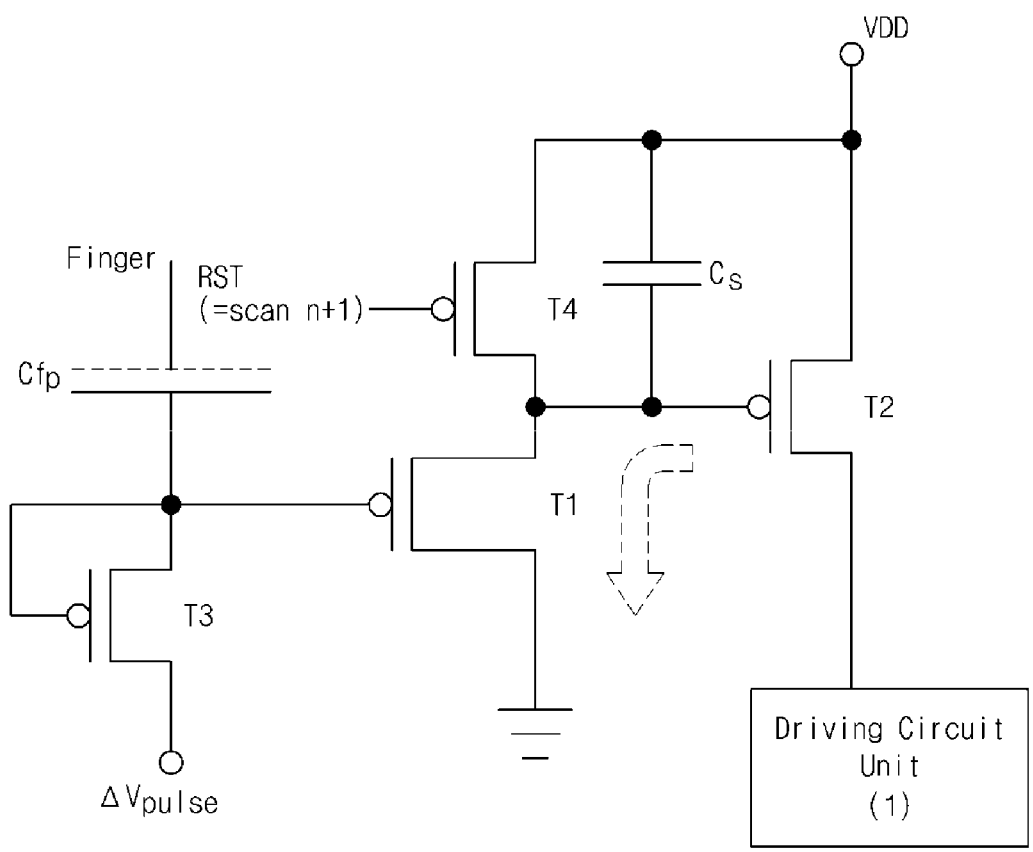
FIG. 5 is an equivalent circuit view illustrating a capacitive fingerprint sensor according to a preferred first exemplary embodiment of the present invention.

FIG. 5 is an equivalent circuit view illustrating a capacitive fingerprint sensor according to a preferred first exemplary embodiment of the present invention.

As illustrated in FIG. 5, the capacitive fingerprint sensor according to the first exemplary embodiment of the present invention may include: a fingerprint sensing electrode Cfp for sensing a human fingerprint; a first transistor T1 in which the amount of currents flowing therethrough changes depending on an output voltage of the fingerprint sensing electrode Cfp; a second transistor T2 in which the amount of currents flowing therethrough changes due to a difference between the currents flowing through the first transistor T1; and a third transistor T3 which resets a gate electrode of the first transistor T1 and provides capacitive coupling with the gate electrode of the first transistor T1 via a pulse signal; a pixel capacitance Cs which is connected between a power supply voltage VDD and a drain electrode of the first transistor T1; and a fourth transistor T4 which is connected between the power supply voltage VDD and the drain electrode of the first transistor T1, and is switched by a scan signal Scan n+1 or a scan signal Scan n−1 to thereby reset the second transistor T2 with the power supply voltage.

Here, the first to the fourth transistors T1, T2, T3 and T4 may be all formed of a PMOS, and the third transistor T3 may be formed in a diode shape in which the drain and gate electrodes are commonly connected to a gate of the first transistor T1. Furthermore, the second transistor T2 is switched by the currents flowing through the first transistor T1 to thereby supply the power supply voltage VDD to a driving circuit unit 1.

The fingerprint sensing electrode Cfp is connected to the drain electrode of the third transistor T3 which is diode-connected, and at the same time the drain electrode of the third transistor T3 is connected to the gate electrode of the first transistor T1. In the first transistor T1, a voltage applied to the gate electrode changes depending on the ridges of a fingerprint, and thus a difference between the currents flowing through the first transistor T1 occurs. When this is called a primary voltage to current conversion and amplification, because the drain electrode of the first transistor T1 is connected to the gate of the second transistor T2, a discharging level of the gate of the second transistor T2 changes depending on the difference between the currents of the first transistor T1, so a gate voltage of the second transistor T2 changes. In the end, depending on the change of the gate voltage of the second transistor T2, a different between the currents flowing through the second transistor T2 occurs. When this is called a secondary voltage to current conversion and amplification, a way in which the difference between the currents generated during the process of the secondary voltage to current conversion and amplification is sensed in the driving circuit unit 1 may be used. This way has a structure in which the processes of the primary and secondary voltage to current conversions and amplifications can be performed within a pixel. A difference between the way according to the exemplary embodiment of the present invention and the conventional fingerprint sensor is that since a protective film of an upper part of the sensor is thick, even in a case that the fingerprint capacitance Cfp is small in size, sensing sensitivity can be improved, so the sensor for sensing fingerprints can be operated without any problem.

2. Second Exemplary Embodiment of Capacitive Fingerprint Sensor

Figure 6:
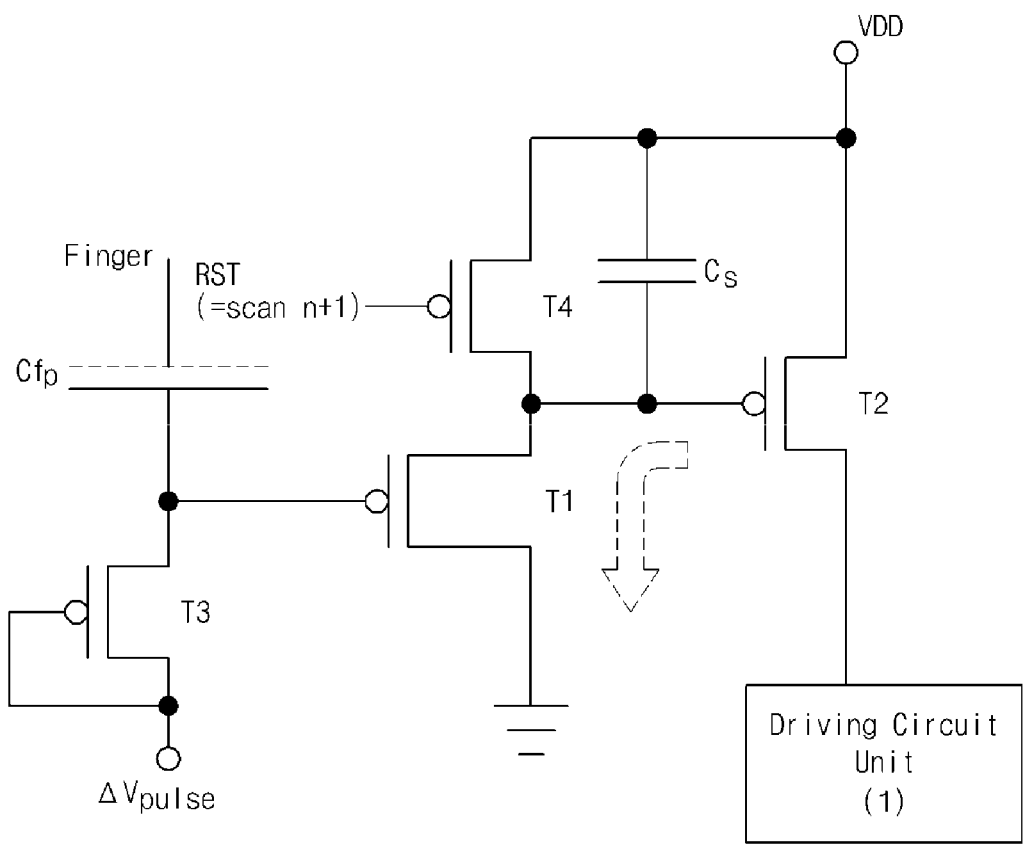
FIG. 6 is an equivalent circuit view illustrating a capacitive fingerprint sensor according to a preferred second exemplary embodiment of the present invention.

FIG. 6 is an equivalent circuit view illustrating a capacitive fingerprint sensor according to a preferred second exemplary embodiment of the present invention.

As illustrated in FIG. 6, the capacitive fingerprint sensor according to the second exemplary embodiment of the present invention may include: a fingerprint sensing electrode Cfp for sensing a human fingerprint; a first transistor T1 in which the amount of currents flowing therethrough changes depending on an output voltage of the fingerprint sensing electrode Cfp; a second transistor T2 in which the amount of currents flowing therethrough changes due to a difference between the currents flowing through the first transistor T1; and a third transistor T3 which resets a gate electrode of the first transistor T1 and provides capacitive coupling with the gate electrode of the first transistor T1 via a pulse signal; a pixel capacitance Cs which is connected between a power supply voltage VDD and a drain electrode of the first transistor T1; and a fourth transistor T4 which is connected between the power supply voltage VDD and the drain electrode of the first transistor T1, and is switched by a scan signal Scan n+1 to thereby reset the second transistor T2 with the power supply voltage.

Here, the first transistor T1 may be formed of an NMOS, and the second to fourth transistors T2, T3 and T4 may be all formed of a PMOS. The third transistor T3 may be formed in a diode shape in which source and gate electrodes are commonly connected, and may be configured such that a pulse signal $\Delta V_{pulse}$ is applied to a source electrode and the gate electrode of the third transistor T3. Furthermore, the second transistor T2 is switched by the currents flowing through the first transistor T1 to thereby supply the power supply voltage VDD to the driving circuit unit 1.

The third transistor T3 may be configured such that like FIG. 5, when the first transistor T1 is formed of the PMOS, the drain and gate electrodes are commonly connected to the gate of the first transistor T1, and like FIG. 6, when the first transistor T1 is formed of the NMOS, the pulse signal is commonly inputted through the gate and source electrodes.

3. Third Exemplary Embodiment of Capacitive Fingerprint Sensor

Figure 7:
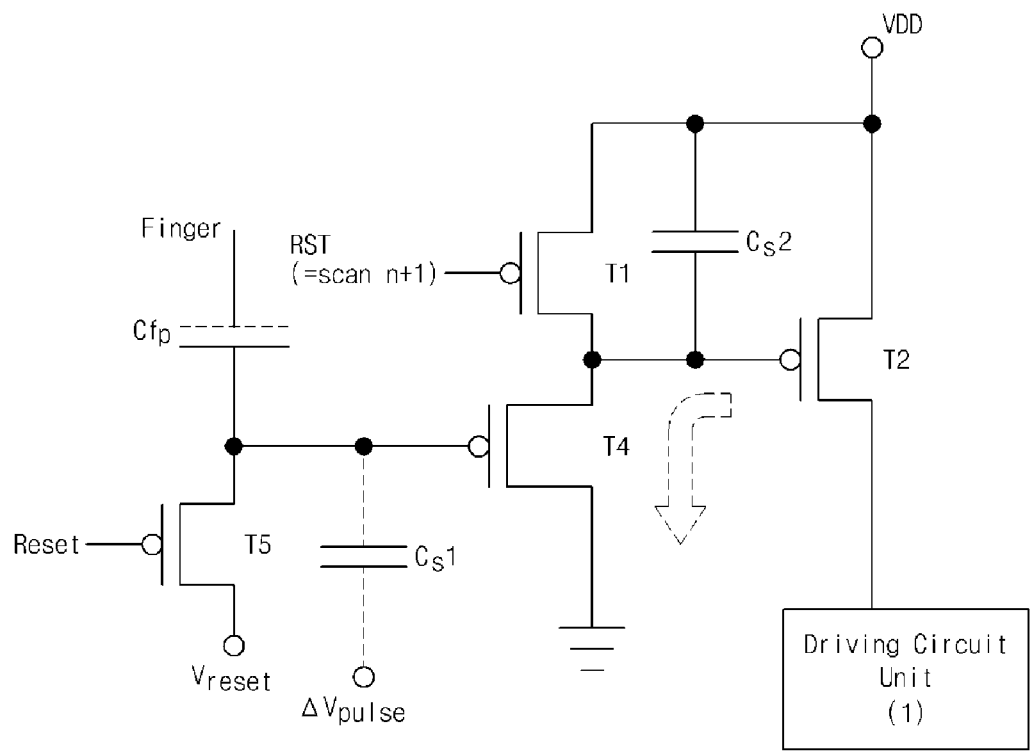
FIG. 7 is an equivalent circuit view illustrating a capacitive fingerprint sensor according to a preferred third exemplary embodiment of the present invention.

FIG. 7 is an equivalent circuit view illustrating a capacitive fingerprint sensor according to a preferred third exemplary embodiment of the present invention.

As illustrated in FIG. 7, the capacitive fingerprint sensor according to the third exemplary embodiment of the present invention may include: a fingerprint sensing electrode Cfp for sensing a human fingerprint; a first transistor T1 in which the amount of currents flowing therethrough changes depending on an output voltage of the fingerprint sensing electrode Cfp; a second transistor T2 in which the amount of currents flowing therethrough changes due to a difference between the currents flowing through the first transistor T1; and a third transistor T3 which resets a gate electrode of the first transistor T1 depending on a reset signal; a pixel capacitance Cs which is connected between a power supply voltage VDD and a drain electrode of the first transistor T1; a coupling capacitor Cs1 which provides capacitive coupling with the gate electrode of the first transistor T1; and a fourth transistor T4 which is connected between the power supply voltage VDD and the drain electrode of the first transistor T1, and is switched by a scan signal Scan n+1 to thereby reset the second transistor T2 with the power supply voltage.

Here, the first to the fourth transistors T1, T2, T3 and T4 may be all formed of a PMOS, and may control a switching operation of the third transistor T3 by inputting a reset signal using a gate electrode of the third transistor T3. Furthermore, the second transistor T2 is switched by the currents flowing through the first transistor to thereby supply the power supply voltage VDD to the driving circuit unit 1.

A difference between the capacitive fingerprint sensors as illustrated in FIG. 5, FIG. 6 and FIG. 7 is a difference between methods of resetting the gate of the first transistor T1. The third transistor T3 in FIG. 5 is a TFT which is diode-connected, and performs resetting and capacitive coupling. The third transistor T3 in FIG. 6 may have a diode-connected direction which is opposed and may be manufactured in different directions from each other depending on whether a thin film transistor which is used is the NMOS or the PMOS.

Like FIG. 5, when the first transistor T1 is the PMOS, the gate of the third transistor T3 is connected toward $\Delta V_{pulse}$. Like FIG. 6, when the first transistor T1 is the NMOS, the gate of the third transistor T3 is connected toward the fingerprint sensing electrode Cfp. On the other hand, the third transistor T3 in FIG. 7 functions to reset the gate of the first transistor T1, and the capacitive coupling is performed by a separate capacitance, the coupling capacitor Cs1.

The thin film transistor may be used within the pixel by using each of the NMOS and the PMOS or by mixing them. An operating principle with the PMOS is explained as follows.

In the capacitive fingerprint sensor according to this exemplary embodiment of the present invention, the fingerprint sensor may be driven by two methods depending on $\Delta V_{pulse}$ of FIG. 5.

That is, there are a method of sensing a change of the gate voltage of the second transistor which is generated during one frame through continuous capacitive coupling while applying $\Delta V_{pulse}$ to a clock signal, in which a high voltage and a low voltage are repeated, during one frame, and a method of sensing a change of the gate voltage of the second transistor which is generated through one capacitive coupling when a scan signal is selected.

Like the firstly mentioned method, in a case where $\Delta V_{pulse}$ is applied to the clock signal in which a high voltage and a low voltage are repeated on a fixed cycle (see FIG. 11), when $\Delta V_{pulse}$ is the high voltage, the third transistor T3 of FIG. 5 may be turned on so that the currents flow. As a result of this, the gate voltage of the first transistor T1 may be set up as the high voltage.

On the other hand, when $\Delta V_{pulse}$ is the low voltage, the third transistor may be turned off. A gate node of the first transistor T1 which is floated may go down to the low voltage due to a capacitive coupling phenomenon. At this time, the capacitive coupling may be determined by following mathematical formula 2.

$$\Delta V_{g\_T1} = \frac{C_{para\_T3}}{C_{para\_T3} + C_{para\_T2} + C_{fp}} \times \Delta V_{pulse} \quad \{\text{Mathematical Formula 2}\}$$

In mathematical formula 2, $\Delta V_{g\_T1}$ is a change of the gate voltage due to the capacitive coupling of the first transistor T1, $C_{para\_T3}$ is a parasitic capacitance of the third transistor T3, and Cfp is a fingerprint capacitance.

Figure 10:
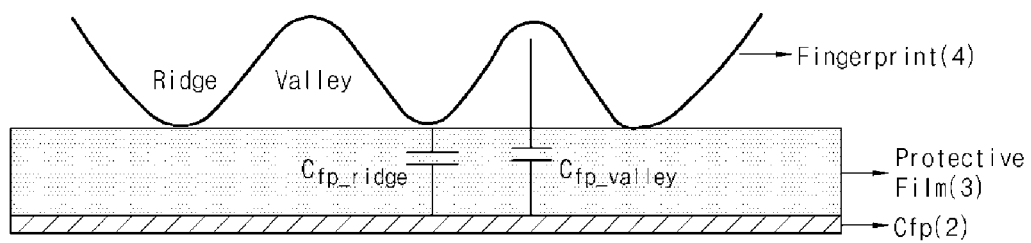
FIG. 10 is a cross-sectional view illustrating a structure of a capacitive fingerprint sensor according to the present invention.
Figure 11:
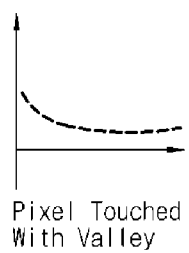
FIG. 11 is a view illustrating a voltage waveform of a gate electrode of a first transistor and a second transistor in the case of applying a pulse signal $\Delta V_{pulse}$ during one frame by repeating a high voltage and a low voltage.
Figure 11:
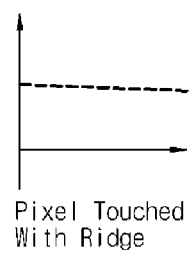

As illustrated in FIG. 10 and FIG. 11, the fingerprint has a difference in heights depending on its ridges and valleys, and depending on this difference, a difference between the electrode and formed capacitances is generated.

As illustrated in FIG. 10 and FIG. 11, due to the difference between the capacitances, as the previously mentioned mathematical formula, a difference between the gate voltages of the first transistor T1 is generated by the capacitive coupling, and the currents flowing through the first transistor T1 change as much as the difference between the gate voltages.

The gate voltage of the second transistor T2 is discharged by the currents flowing through the first transistor T1. When $\Delta V_{pulse}$ is continuously applied during one frame, depending on a level discharged during the period, the gate voltage of the second transistor T2 is determined.

4. Fourth and Fifth Exemplary Embodiment of Capacitive Fingerprint Sensor

Figure 8:
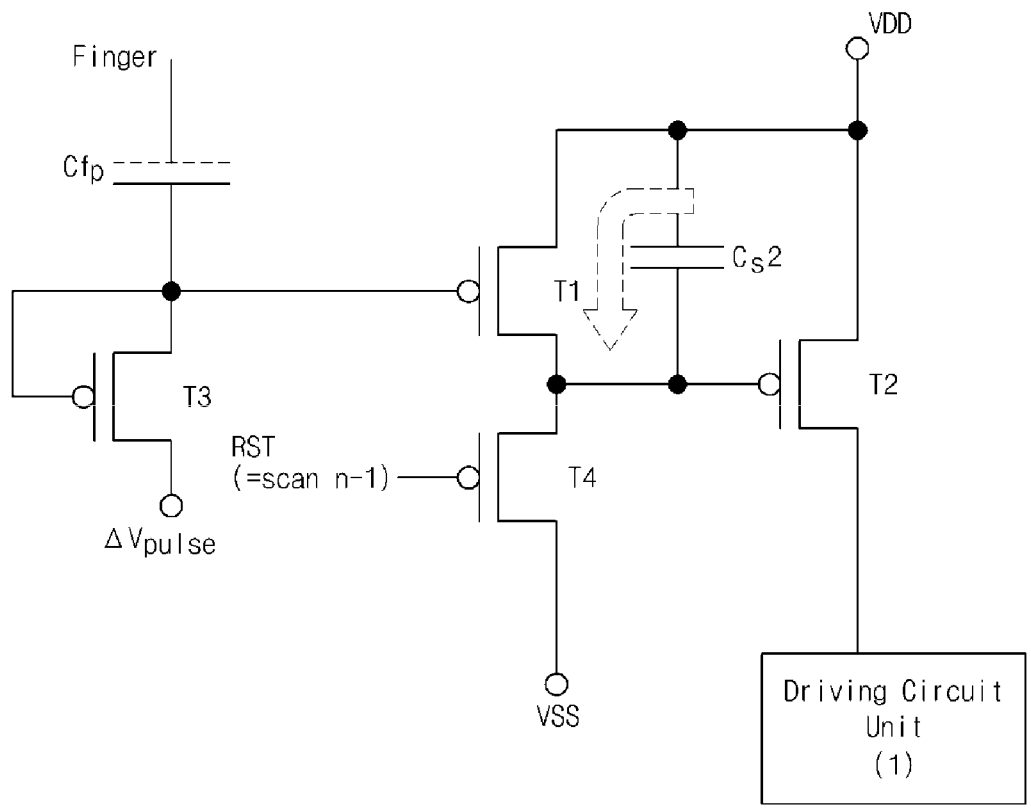
FIG. 8 is an equivalent circuit view illustrating a capacitive fingerprint sensor according to a preferred fourth exemplary embodiment of the present invention.

Like the previously mentioned secondary driving method, even a case that $\Delta V_{pulse}$ is changed to a low voltage or a high voltage one time when an $n^{th}$ scan signal is applied, the third transistor T3 of FIG. 8 may be turned on when $\Delta V_{pulse}$ is the high voltage, so the currents flow. As a result of this, the gate voltage of the first transistor T1 may be set up as the high voltage. On the other hand, when $\Delta V_{pulse}$ is the low voltage, the third transistor T3 may be turned off, and the gate node of the first transistor T1 which is floated may go down to the low voltage due to a capacitive coupling phenomenon.

At this time, $\Delta V_{pulse}$ may go down to the low voltage one time during one frame, and at this time capacitive coupling may occur. Thus, $\Delta V_{pulse}$ should be converted to the low voltage at the time of capable of leading out in the driving circuit unit as the $n^{th}$ scan signal is selected. When the scan signal Scan n−1 is selected, the gate of the first transistor may be reset.

Figure 12:
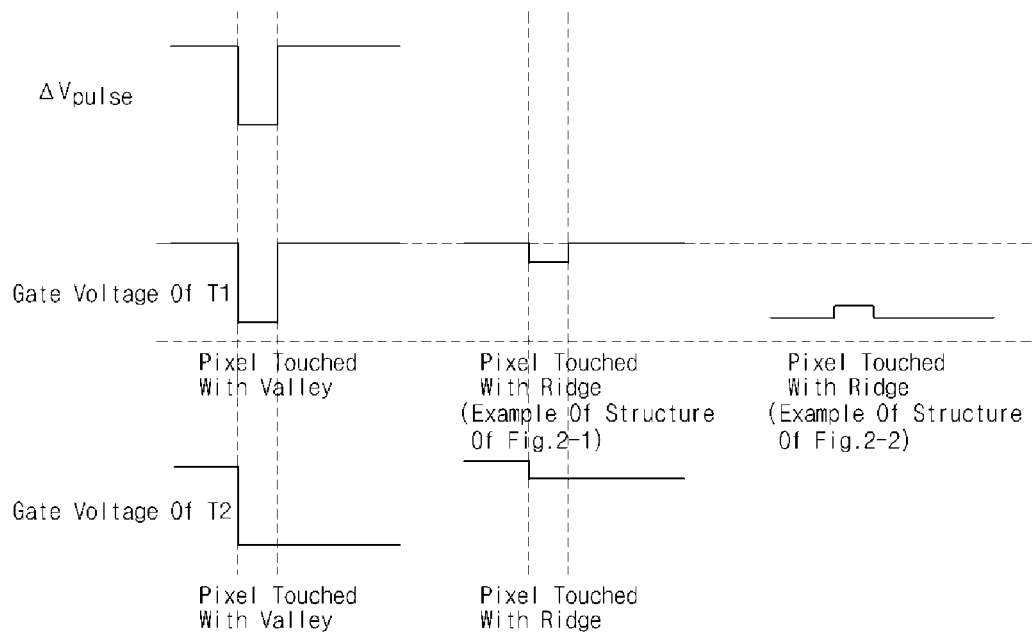
FIG. 12 is a view illustrating a voltage waveform of the gate electrode of the first and second transistors in a case where the pulse signal $\Delta V_{pulse}$ is changed from a high voltage to a low voltage or from a low voltage to a high voltage one time during the period when an $N^{th}$ scan signal is selected.
Figure 13:
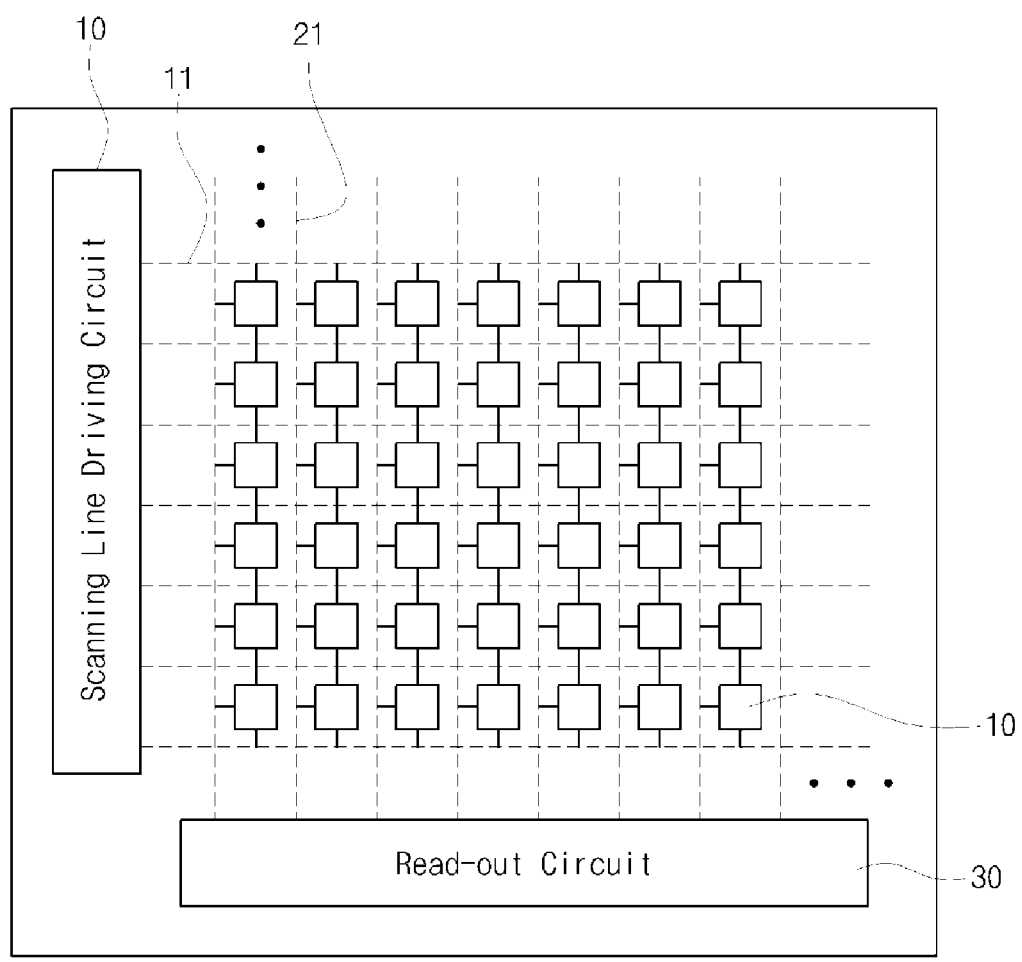
FIG. 13 is a view illustrating an example of a driving circuit for driving the fingerprint sensor of the present invention and a fingerprint sensor array.

As illustrated in FIG. 10 and FIG. 12, due to the difference between the capacitances, the difference between the gate voltages of the first transistor T1 is generated by the capacitive coupling as the aforesaid-mentioned mathematical formula, and the currents flowing through the first transistor T1 change as much as the difference between the gate voltages.

The gate voltage of the second transistor T2 is discharged by the currents flowing through the first transistor T1. Depending on a discharged level, the gate voltage of the second transistor T2 is determined. Unlike accumulating the change of the gate voltage during the aforesaid frame, in a driving method of this fingerprint sensor, sensing may be performed during the time of one scan signal selection, and thus if the driving method is used in a case where the level of off-currents of the transistors is high, an operation error of the fingerprint sensor due to the off-currents can be settled.

The conventional capacitive fingerprint sensor using a thin film transistor is disadvantageous that benefit of the second transistor T2 is less than 1, and thus in a case where a change of the gate voltage is not large, a change of the currents flowing through the second transistor T2 is small, thereby reducing sensing sensitivity. However, in a structure of the fingerprint sensor according to this exemplary embodiment of the present invention, a process of primary voltage to current conversion and amplification is performed through the first transistor T1, and due to the difference between the currents of the first transistor T1 generated as a result of this, the gate voltage of the second transistor T2 may be discharged again. Thus, the change of the currents flowing through the second transistor T2 may increase. As a result of this (secondary voltage to current conversion and amplification), it is advantageous that sensing can be performed even in a case that the fingerprint capacitance Cfp is small.

Furthermore, it is advantageous that an area of the gate voltage of the second transistor T2 can be controlled by controlling a voltage level of $\Delta V_{pulse}$.

In a case where a fingerprint sensor using a thin film transistor is developed using the capacitive fingerprint sensor having this structure, sensing sensitivity is not reduced even in a case that a protective film of an upper part of the sensor is thick. Accordingly, the fingerprint sensor which is resistant to ESD damage or a physical impact and has good durability can be manufactured.

Figure 9:
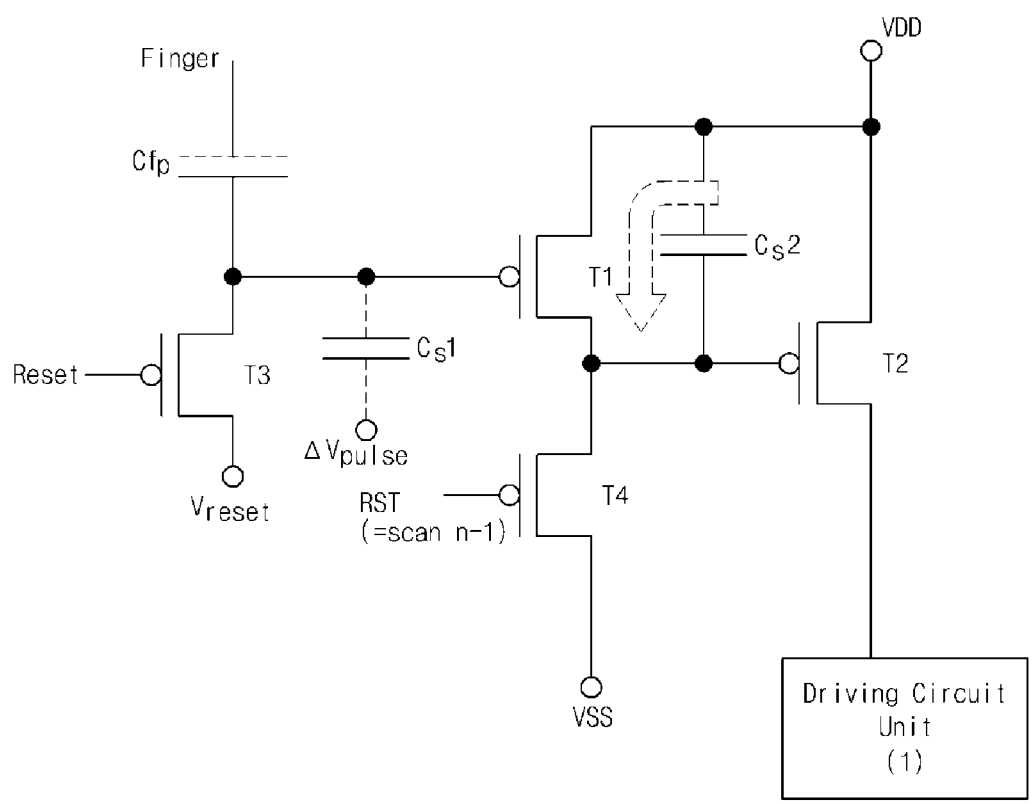
FIG. 9 is an equivalent circuit view illustrating a capacitive fingerprint sensor according to a preferred fifth exemplary embodiment of the present invention.

Like FIG. 6, in a case where the diode connection of the third transistor T3 is performed in an opposite direction, as illustrated in FIG. 9, the gate of the first transistor 0 T1 may be reset when $\Delta V_{pulse}$ is the low voltage, and an increase in the gate voltage of the first transistor T1 may be changed by the capacitive coupling depending on the division of the ridges and valleys of a fingerprint when $\Delta V_{pulse}$ is the high voltage.

When the first transistor T1 is formed of the PMOS, it would be helpful to perform the diode-connection as illustrated in FIG. 5. When the first transistor T1 is formed of the NMOS, it would be helpful to perform the diode-connection as illustrated in FIG. 6.

Like FIG. 7, in the technology of the present invention, the third transistor T3 may function to reset the gate of the first transistor T1 and operate it using a separate coupling capacitor Cs2.

5. Sixth Exemplary Embodiment of Capacitive Fingerprint Sensor

Figure 14:
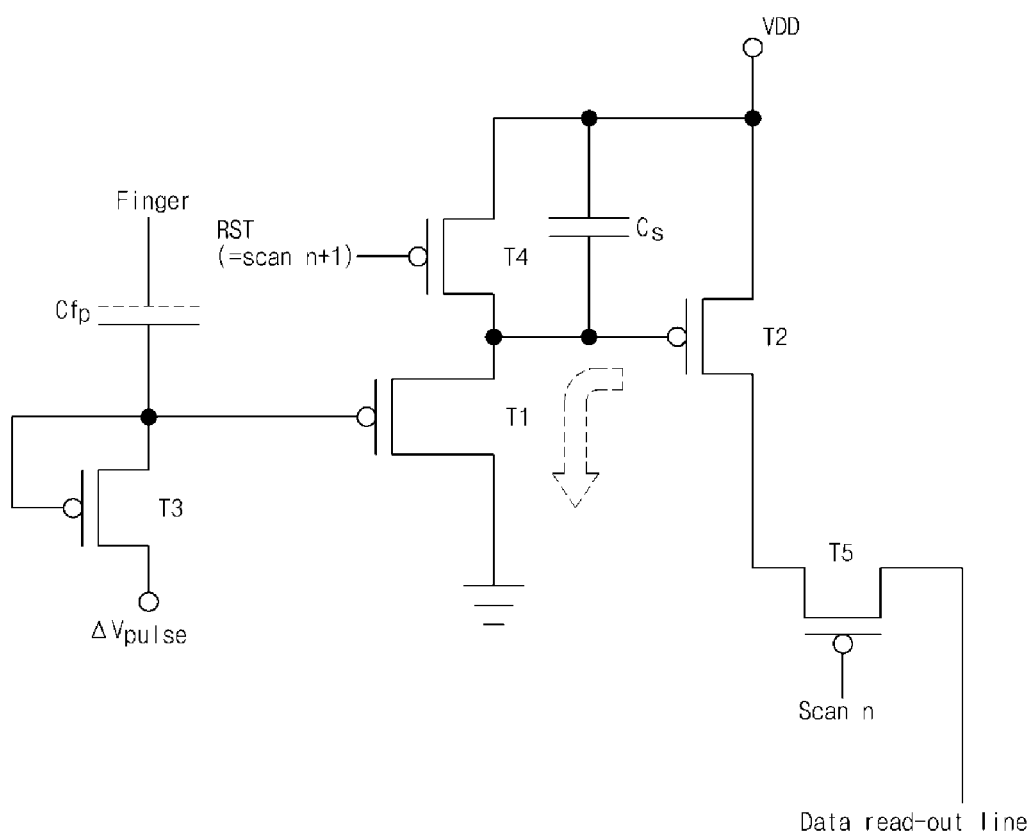
FIG. 14 is an equivalent circuit view illustrating a capacitive fingerprint sensor according to a preferred sixth exemplary embodiment of the present invention.

FIG. 14 is an equivalent circuit view illustrating a capacitive fingerprint sensor according to a preferred sixth exemplary embodiment of the present invention.

As illustrated in FIG. 14, the capacitive fingerprint sensor according to the sixth exemplary embodiment of the present invention may include: a fingerprint sensing electrode Cfp for sensing a human fingerprint; a first transistor T1 in which the amount of currents flowing therethrough changes depending on an output voltage of the fingerprint sensing electrode Cfp; a second transistor T2 in which the amount of currents flowing therethrough changes due to a difference between the currents flowing through the first transistor T1; and a third transistor T3 which resets a gate electrode of the first transistor T1 and provides capacitive coupling with the gate electrode of the first transistor T1 via a pulse signal; a pixel capacitance Cs which is connected between a power supply voltage VDD and a drain electrode of the first transistor T1; a fourth transistor T4 which is connected between the power supply voltage VDD and the drain electrode of the first transistor T1, and is switched by a scan signal Scan n+1 or a scan signal Scan n−1 to thereby reset the second transistor T2 with the power supply voltage; and a fifth transistor T5 which switches the currents flowing through the second transistor T2 depending on a scan signal Scan n so as to flow into a driving circuit unit 1.

Here, the first to fifth transistors T1, T2, T3, T4 and T5 are all formed of an PMOS, and the third transistor T3 is formed in a diode shape in which the drain electrode and the gate electrode are commonly connected to a gate of the first transistor T1.

In the sixth exemplary embodiment, the fourth transistor T4 is added to thereby reset the gate voltage of the second transistor T2 per frames with the power supply voltage VDD. At this time, it can be used two ways: a way in which integration is performed during one frame by connecting the scan signal Scan n+1 corresponding to a next order of a corresponding pixel to the gate of the fourth transistor T4, a reset is performed using the scan signal Scan n+1, and the integration is performed again; and a way in which a reset before sensing is performed one time by connecting the scan signal Scan n−1 corresponding to a former order of a corresponding pixel to the gate of the fourth transistor T4, and sensing is performed at the time when a corresponding scan signal Scan n is selected.

The fifth transistor T5 is a thin film transistor which performs the function of switching, and switches the currents of the second transistor T2 so as to flow into the driving circuit unit 1 through a data read-out line when each scan signal is connected to the gate and selected.

6. Seventh Exemplary Embodiment of Capacitive Fingerprint Sensor

Figure 15:
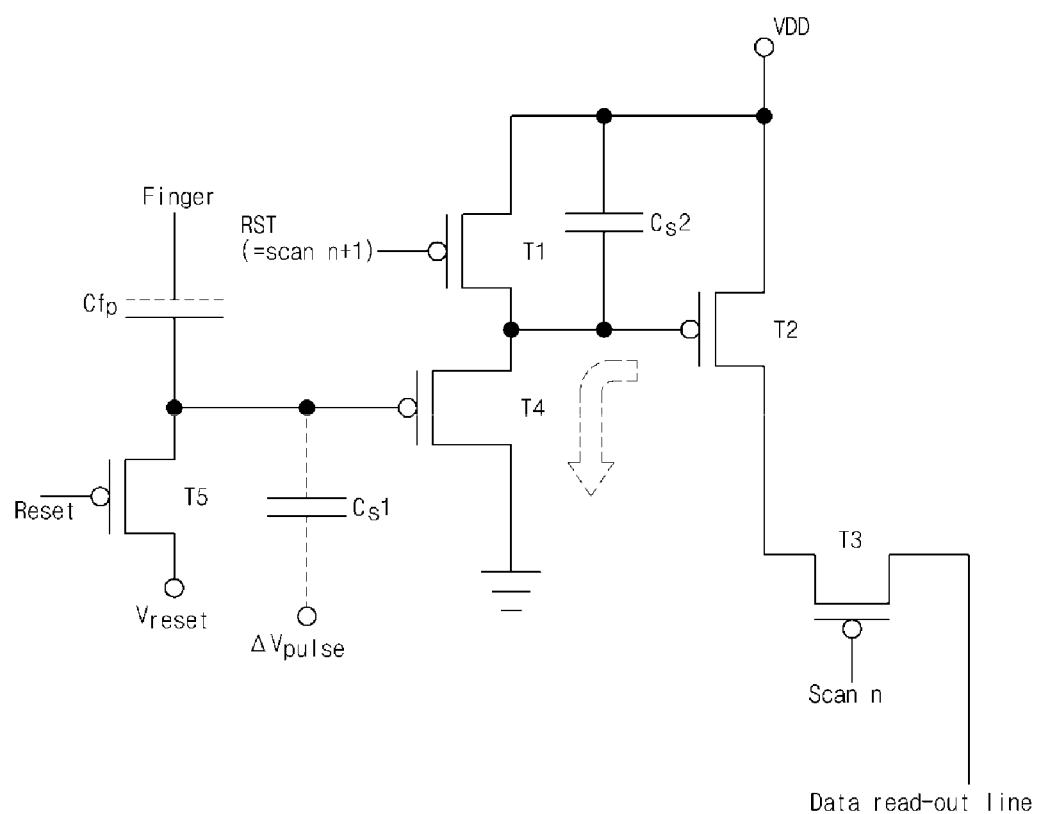
FIG. 15 is an equivalent circuit view illustrating a capacitive fingerprint sensor according to a preferred seventh exemplary embodiment of the present invention.

FIG. 15 is an equivalent circuit view illustrating a capacitive fingerprint sensor according to a preferred Seventh exemplary embodiment of the present invention.

As illustrated in FIG. 15, the capacitive fingerprint sensor according to the seventh exemplary embodiment of the present invention may include: a fingerprint sensing electrode Cfp for sensing a human fingerprint; a first transistor T1 in which the amount of currents flowing therethrough changes depending on an output voltage of the fingerprint sensing electrode Cfp; a second transistor T2 in which the amount of currents flowing therethrough changes due to a difference between the currents flowing through the first transistor T1; and a third transistor T3 which resets a gate electrode of the first transistor T1 depending on a reset signal; a pixel capacitance Cs which is connected between a power supply voltage VDD and a drain electrode of the first transistor T1; a coupling capacitor Cs1 which provides capacitive coupling with the gate electrode of the first transistor T1; a fourth transistor T4 which is connected between the power supply voltage VDD and the drain electrode of the first transistor T1, and is switched by a scan signal Scan n+1 or a scan signal Scan n−1 to thereby reset the second transistor T2 with the power supply voltage; and a fifth transistor T5 which switches the currents flowing through the second transistor T2 depending on the scan signal Scan n so as to flow into a driving circuit unit 1.

Here, the first to fifth transistors T1, T2, T3, T4 and T5 are all formed of the PMOS, and the third transistor T3 is configured such that the drain electrode is connected to a gate of the first transistor T1, and the reset signal for controlling an operating of the third transistor T3 is applied to the gate.

The Seventh exemplary embodiment applies the structure in which in the structure like FIG. 14, the first transistor is used as a transistor for reset purposes, and the coupling capacitor Cs1 is used separately.

7. Eighth Exemplary Embodiment of Capacitive Fingerprint Sensor

Figure 16:
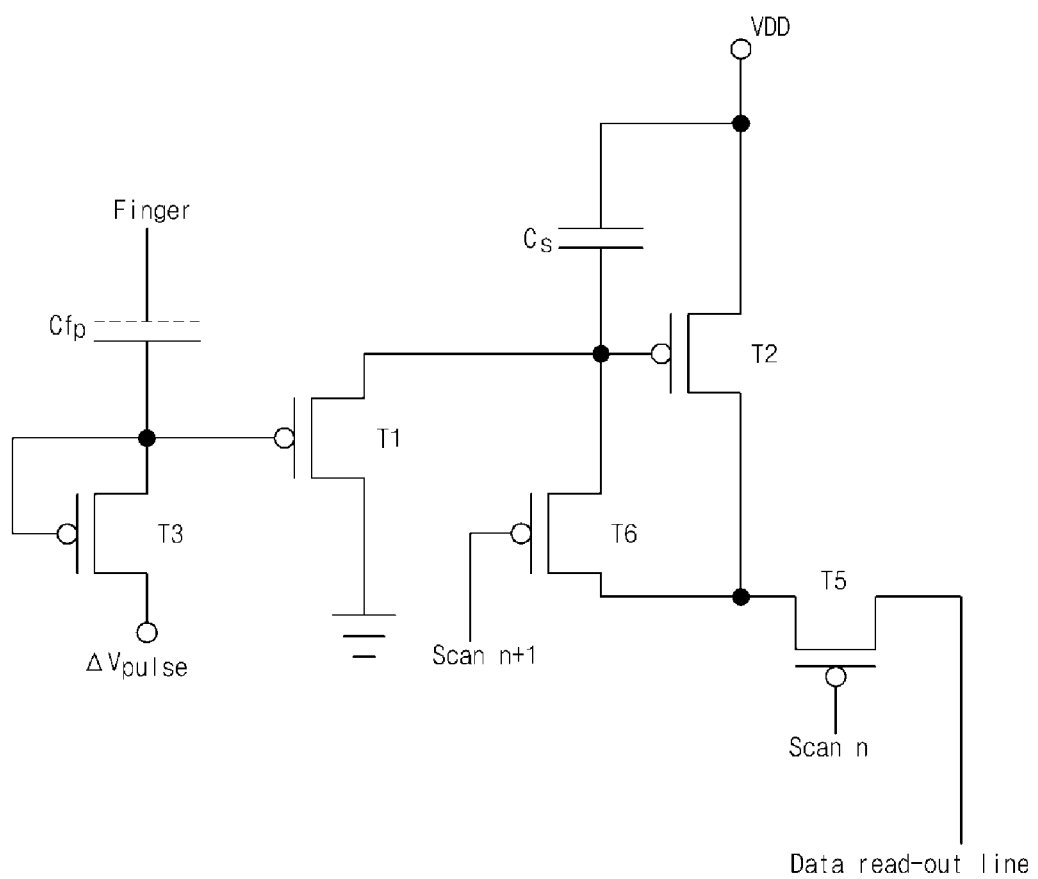
FIG. 16 is an equivalent circuit view illustrating a capacitive fingerprint sensor according to a preferred eighth exemplary embodiment of the present invention.

FIG. 16 is an equivalent circuit view illustrating a capacitive fingerprint sensor according to a preferred eighth exemplary embodiment of the present invention.

As illustrated in FIG. 16, the capacitive fingerprint sensor according to the eighth exemplary embodiment of the present invention may include: a fingerprint sensing electrode Cfp for sensing a human fingerprint; a first transistor T1 in which the amount of currents flowing therethrough changes depending on an output voltage of the fingerprint sensing electrode Cfp; a second transistor T2 in which the amount of currents flowing therethrough changes due to a difference between the currents flowing through the first transistor T1; and a third transistor T3 which resets a gate electrode of the first transistor T1 and provides capacitive coupling with the gate electrode of the first transistor T1 via a pulse signal; a pixel capacitance Cs which is connected between a power supply voltage VDD and a drain electrode of the first transistor T1; a fifth transistor T5 which switches the currents flowing through the second transistor T2 depending on a scan signal Scan n so as to flow into a driving circuit unit 1; and a sixth transistor T6 which is connected between the drain electrode and the gate electrode of the second transistor T2, and is switched by a scan signal Scan n+1 or a scan signal Scan n−1 to thereby reset the gate electrode of the second transistor T2 while compensating a difference between threshold voltages.

Here, the first to third transistors T1, T2 and T3, and the fifth and sixth transistors T5 and T6 are all formed of a PMOS, and the third transistor T3 is formed in a diode shape in which the drain electrode and the gate electrode are commonly connected to a gate of the first transistor T1.

The eighth exemplary embodiment has a structure in which a source of the sixth transistor T6 is connected to the drain of the second transistor T2 other than the power supply voltage VDD. In this case, a difference between the threshold voltages Vth of the second transistor T2 is compensated. The threshold voltages Vth of the second transistor which exist in each pixel within a sensor array may be different from each other. When the structure as shown in the exemplary embodiment of FIG. 16 is used, the threshold voltages Vth of the second transistor T2 other than a reset voltage of the gate of the second transistor T2 becomes the power supply voltage VDD.

Accordingly, the gate voltage of the second transistor T2 becomes $V_{th\_T2}$-$V_{discharging}$ after integration. Since the currents based on to the gate voltage flow through the second transistor T2, to a pixel including a source follower, namely, the T2 in which the threshold voltage Vth is large, the gate voltage as much as the threshold voltage Vth is applied, and to a pixel including a source follower, namely, T2 in which the threshold voltage Vth is small, the gate voltage as less as the threshold voltage Vth is applied, so the currents as much as the compensated threshold voltage Vth flow. Therefore, non-uniformity of the threshold voltage Vth of the sensor array may be compensated.

The capacitive fingerprint sensor according to this exemplary embodiment of the present invention which is configured as above may be formed in the structure which can be multi-amplified within the pixel, thereby enhancing sensing sensitivity. Accordingly, the technical problems of the present invention can be solved.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A capacitive fingerprint sensor comprising:
    a fingerprint sensing electrode Cfp for sensing a human fingerprint;
    a first transistor T1 electrically coupled with the fingerprint sensing electrode Cfp such that a first amount of current flowing through the first transistor varies based on an output voltage of the fingerprint sensing electrode;
    a second transistor T2 electrically coupled with the first transistor T1 such that a second amount of current flowing through the second transistor T2 varies based on the first amount of current flowing through the first transistor T1; and
    a third transistor T3 electrically coupled with the first transistor T1 which resets a gate electrode of the first transistor T1 and provides capacitive coupling with the gate electrode of the first transistor T1 via a pulse signal.

2. The capacitive fingerprint sensor of claim 1 wherein a pixel capacitor Cs is connected to or between a drain electrode of the first transistor T1 and a power supply voltage.

3. The capacitive fingerprint sensor of claim 2, further comprising a fourth transistor T4 with a source electrode and a drain electrode of the fourth transistor T4 connected between the power supply voltage and the drain electrode of the first transistor T1, and a gate electrode of the fourth transistor T4 is switched by a scan signal Scan n+1 or a scan signal Scan n−1 to thereby reset the second transistor T2 with the power supply voltage.

4. The capacitive fingerprint sensor of claim 1 wherein a gate electrode of the third transistor T3 is electrically coupled with one of a drain electrode or a source electrode of the third transistor T3.

5. The capacitive fingerprint sensor of claim 4 wherein the third transistor T3 is configured such that the drain and gate electrodes are commonly connected to a gate of the first transistor T1 when the first transistor T1 is a PMOS.

6. The capacitive fingerprint sensor of claim 4 wherein the third transistor T3 inputs commonly the pulse signal through the gate electrode and a source electrode when the first transistor T1 is an NMOS.

7. The capacitive fingerprint sensor of claim 1 wherein the third transistor T3 switches the pulse signal using the gate of the first transistor T1.

8. The capacitive fingerprint sensor of claim 1 wherein a source electrode and a drain electrode of the second transistor T2 are connected between the power supply voltage and a driving circuit unit.

9. The capacitive fingerprint sensor of claim 1 wherein the pulse signal is formed as a clock signal in which a high voltage and a low voltage are repeated, the clock signal being continuously applied during one frame.

10. The capacitive fingerprint sensor of claim 9 wherein the first transistor T1 is reset at the high voltage of the pulse signal, and is coupled at the low voltage of the pulse signal, or the first transistor T1 is coupled at the low voltage of the pulse signal, and is reset at the high voltage of the pulse signal.

11. The capacitive fingerprint sensor of claim 1 wherein the pulse signal is maintained as a high voltage during one frame, and then when a scan signal Scan n is applied to a corresponding pixel, the pulse signal is converted to a low voltage one time, or the pulse signal is maintained as a low voltage during one frame, and then when a scan signal Scan n is applied to a corresponding pixel, the pulse signal is converted to a high voltage one time.

12. The capacitive fingerprint sensor of claim 1 wherein the fingerprint sensing electrode Cfp is formed of a fingerprint capacitance Cfp electrode and a protective film, and senses a difference between the fingerprint capacitance Cfp electrode and a formed capacitance depending on a difference in heights between the ridges and valleys of a fingerprint sensed in the protective film.

13. The capacitive fingerprint sensor of claim 1 wherein a voltage level of the pulse signal is controlled to thereby control the second amount of current flowing through the second transistor T2.

14. The capacitive fingerprint sensor of claim 13, further comprising a fourth transistor with a source electrode and a drain electrode of the fourth transistor connected between the gate electrode of the second transistor T2 and a power supply voltage, and is switched by a scan signal Scan n+1 or a scan signal Scan n−1 to thereby reset a gate voltage of the second transistor.

15. The capacitive fingerprint sensor of claim 13, further comprising a sixth transistor with a source electrode and a drain electrode of the sixth transistor connected between the gate electrode and the drain electrode of the second transistor T2, and is switched by a scan signal Scan n+1 or a scan signal Scan n−1 to thereby reset a gate voltage of the second transistor T2 while compensating for differences in a threshold voltage of the second transistor T2.

16. The capacitive fingerprint sensor of claim 1, further comprising a fifth transistor which switches the second amount of current flowing through the second transistor T2 depending on a scan signal Scan n so as to flow into a driving circuit unit.

17. The capacitive fingerprint sensor of claim 1 wherein the applied transistors are formed of a PMOS or an NMOS.

* * * * *